(12) United States Patent
Cheng et al.

(10) Patent No.: US 8,766,088 B2
(45) Date of Patent: Jul. 1, 2014

(54) DOPANT-CONTAINING CONTACT MATERIAL

(75) Inventors: Long Cheng, Perrysburg, OH (US); Akhlesh Gupta, Sylvania, OH (US); Anke Abken, Whitehouse, OH (US); Benyamin Buller, Sylvania, OH (US)

(73) Assignee: First Solar, Inc., Perrysburg, OH (US)

(*) Notice: Subject to any disclaimer, the term of this patent is extended or adjusted under 35 U.S.C. 154(b) by 313 days.

(21) Appl. No.: 12/793,456

(22) Filed: Jun. 3, 2010

(65) Prior Publication Data

US 2010/0326491 A1    Dec. 30, 2010

Related U.S. Application Data

(60) Provisional application No. 61/184,215, filed on Jun. 4, 2009.

(51) Int. Cl.
*H01L 31/0224*    (2006.01)
*H01L 31/0296*    (2006.01)

(52) U.S. Cl.
CPC .................. *H01L 31/022425* (2013.01); *H01L 31/0296* (2013.01)
USPC .............. 136/256; 136/264; 136/260

(58) Field of Classification Search
CPC ........ H01L 21/28537; H01L 21/2855; H01L 21/28568; H01L 31/022425
USPC ................... 257/E31.031; 136/265
See application file for complete search history.

(56) References Cited

U.S. PATENT DOCUMENTS

| | | | |
|---|---|---|---|
| 4,742,014 A | | 5/1988 | Hooper et al. |
| 4,826,777 A | | 5/1989 | Ondris |
| 4,950,327 A | | 8/1990 | Eck et al. |
| 5,421,909 A | * | 6/1995 | Ishikawa et al. ............ 136/256 |
| 5,626,688 A | | 5/1997 | Probst et al. |
| 5,922,142 A | | 7/1999 | Wu et al. |
| 6,169,246 B1 | | 1/2001 | Wu et al. |
| 6,784,361 B2 | | 8/2004 | Carlson et al. |
| 7,390,961 B2 | | 6/2008 | Aschenbrenner et al. |
| 2005/0028861 A1 | * | 2/2005 | Aoki et al. ................... 136/256 |
| 2005/0268959 A1 | * | 12/2005 | Aschenbrenner et al. .... 136/244 |
| 2008/0053519 A1 | | 3/2008 | Pearce et al. |
| 2008/0110498 A1 | * | 5/2008 | Zafar et al. .................. 136/260 |

FOREIGN PATENT DOCUMENTS

WO    WO2008/026322    3/2008

OTHER PUBLICATIONS

Romeo, A. et al., "Development of Thin-film Cu(In,Ga)Se2 and CdTe Solar Cells," 2004, Progress in Photovoltaics: Research and Applications, 12, 93-111.*
An International Search Report and Written Opinion, both dated Aug. 13, 2010, issued in corresponding International Application No. PCT/US2010/036894.
Mathew, Xavier et al., "CdTe/CdS solar cells on flexible substrates," Solar Energy 77 (2004), pp. 831-838.
Raviendra, et al. "Electroless Deposition of Cadmium Stannate, Zinc Oxide, and Aluminum-Doped Zinc Oxide," Journal of Applied Physics, Jul. 15, 1985, vol. 58, No. 2, pp. 838-844.

(Continued)

*Primary Examiner* — James Lin
*Assistant Examiner* — Dujuan Horton
(74) *Attorney, Agent, or Firm* — Dickstein Shapiro LLP

(57) ABSTRACT

A photovoltaic device can include a doped contact layer adjacent to a semiconductor absorber layer, where the doped contact layer includes a metal base material and a dopant.

5 Claims, 2 Drawing Sheets

(56) References Cited

OTHER PUBLICATIONS

Von Roedern, et al. "Material Requirements for Buffer Layers Used to Obtain Solar Cells with High Open Circuit Voltages," National Renewable Energy Laboratory, Material Research Society's Spring Meeting, San Francisco, CA, Apr. 6-10, 1999.

Scofield, et al. "Sputtered Molybdenum Bilayer Back Contact for Copper Indium Diselenide-Based Polycrystalline Thin-Film Solar Cells," Thin Solid Films, 260 (1), pp. 26-31, May 1, 1995.

Pudov, et al. "Effect of Back-Contact Copper Concentration on CdTe Cell Operation," Photovoltaic Specialists Conference 2002, Conference Record of the Twenty-Ninth IEEE, pp. 760-760, May 19-24, 2002.

Jenkins, et al. "CdTe Back Contact: Response to Copper Addition and Out-Diffusion," NCPV and Solar Program Review Meeting 2003.

* cited by examiner

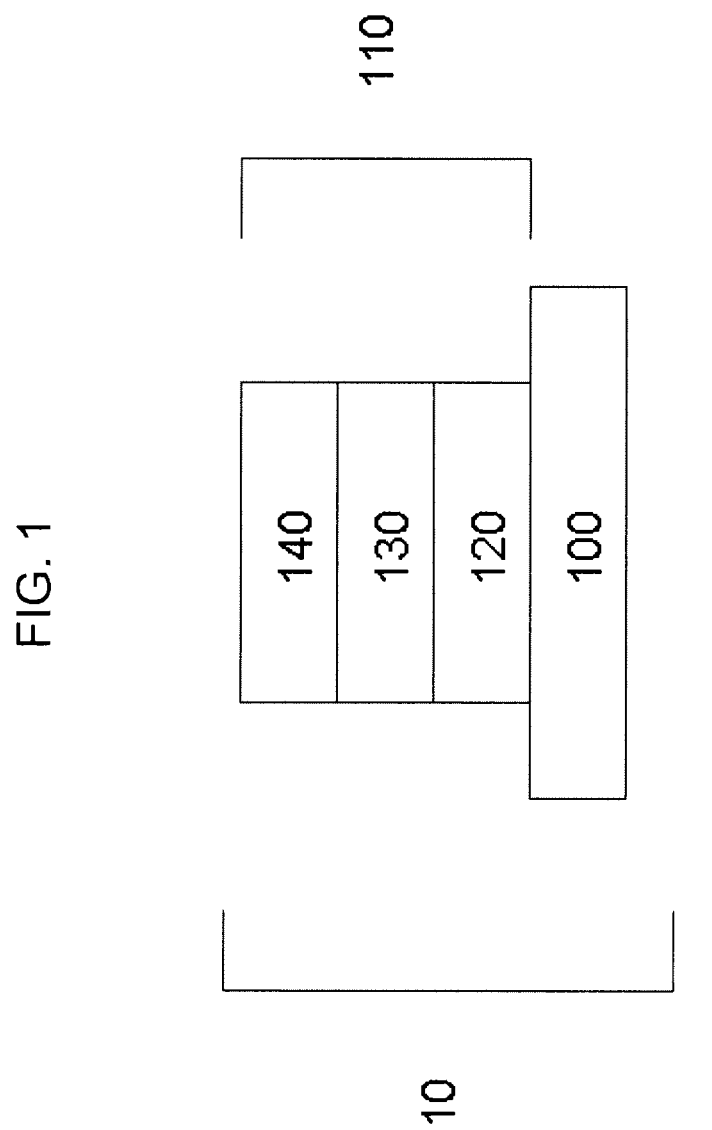

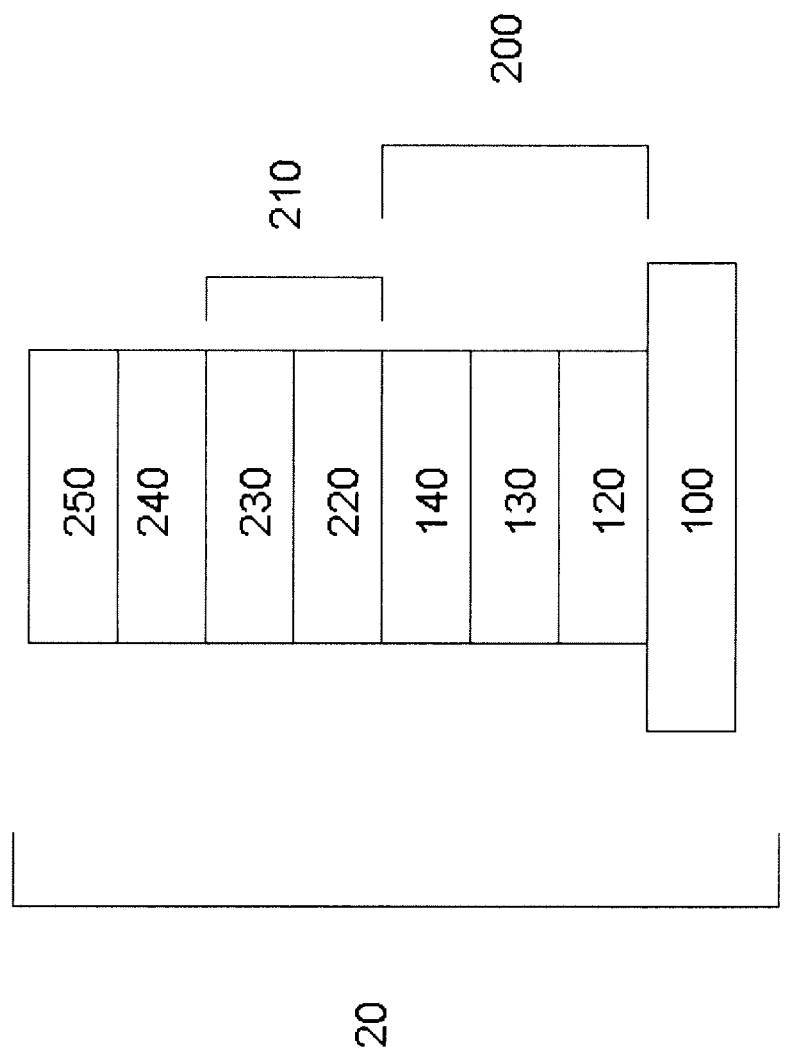

DOPANT-CONTAINING CONTACT MATERIAL

CLAIM FOR PRIORITY

This application claims priority under 35 U.S.C. §119(e) to U.S. Provisional Patent Application Ser. No. 61/184,215 filed on Jun. 4, 2009, which is hereby incorporated by reference.

TECHNICAL FIELD

The present invention relates to photovoltaic devices and methods of production.

BACKGROUND

Photovoltaic devices can include semiconductor material deposited over a substrate, for example, with a first layer serving as a window layer and a second layer serving as an absorber layer. The semiconductor window layer can allow the penetration of solar radiation to the absorber layer, such as a cadmium telluride layer, which converts solar energy to electricity. Photovoltaic devices can also contain one or more transparent conductive oxide layers, which are also often conductors of electrical charge.

DESCRIPTION OF DRAWINGS

FIG. 1 is a schematic of a photovoltaic device having multiple layers.

FIG. 2 is a schematic of a photovoltaic device having multiple layers.

DETAILED DESCRIPTION

Photovoltaic devices can include multiple layers created on a substrate (or superstrate). For example, a photovoltaic device can include a barrier layer, a transparent conductive oxide (TCO) layer, a buffer layer, and a semiconductor layer formed in a stack on a substrate. Each layer may in turn include more than one layer or film. For example, the semiconductor layer can include a first film including a semiconductor window layer, such as a cadmium sulfide layer, formed on the buffer layer and a second film including a semiconductor absorber layer, such as a cadmium telluride layer formed on the semiconductor window layer. Additionally, each layer can cover all or a portion of the device and/or all or a portion of the layer or substrate underlying the layer. For example, a "layer" can include any amount of any material that contacts all or a portion of a surface.

In one aspect, a photovoltaic device can include a doped contact layer adjacent to a semiconductor absorber layer. The doped contact layer can include a metal base material and a dopant.

The metal base material can include a molybdenum. The dopant can include a copper. The doped contact layer can include a copper-doped molybdenum. The doped contact layer can include a copper concentration of about 0.1% to about 10%. The metal base material can include molybdenum, aluminum, chromium, iron, nickel, titanium, vanadium, manganese, cobalt, zinc, ruthenium, tungsten, silver, gold, or platinum. The dopant can include copper, antimony, potassium, sodium, cesium, silver, gold, phosphorous, arsenic, or bismuth. The semiconductor absorber layer can include a cadmium telluride layer. The photovoltaic device can include a semiconductor window layer. The semiconductor absorber layer can be positioned adjacent to the semiconductor window layer. The semiconductor window layer and the semiconductor absorber layer can be at least a part of a semiconductor bi-layer. The semiconductor window layer can include a cadmium sulfide layer. The photovoltaic device can include a transparent conductive oxide stack. The semiconductor bi-layer can be positioned adjacent to the transparent conductive oxide stack. The photovoltaic device can include a first substrate. The transparent conductive oxide stack can be positioned adjacent to the first substrate. The first substrate can include a glass, for example, a soda-lime glass. The transparent conductive oxide stack can include a buffer layer positioned adjacent to a transparent conductive oxide layer. The transparent conductive oxide layer can be positioned adjacent to one or more barrier layers. The transparent conductive oxide layer can include a cadmium stannate. The buffer layer can include a zinc tin oxide, tin oxide, zinc oxide, or zinc magnesium oxide. Each of the one or more barrier layers can include a silicon nitride, aluminum-doped silicon nitride, silicon oxide, aluminum-doped silicon oxide, boron-doped silicon nitride, phosphorous-doped silicon nitride, silicon oxide-nitride, or tin oxide. The photovoltaic device can include a back support adjacent to the back contact.

In one aspect, a method for manufacturing a photovoltaic device can include depositing a doped contact layer adjacent to a semiconductor absorber layer. The doped contact layer can include a metal base material and a dopant.

Depositing a doped contact layer adjacent to a semiconductor absorber layer can include sputtering a copper-doped metal base material onto a cadmium telluride. Depositing a doped contact layer adjacent to a semiconductor absorber layer can include sputtering a doped molybdenum onto a cadmium telluride layer. Depositing a doped contact layer adjacent to a semiconductor absorber layer can include sputtering a copper-doped molybdenum onto a cadmium telluride layer. The copper-doped molybdenum can include a copper concentration of about 0.1% to about 10%. The metal base material can include molybdenum, aluminum, chromium, iron, nickel, titanium, vanadium, manganese, cobalt, zinc, ruthenium, tungsten, silver, gold, or platinum. The dopant can include copper, antimony, potassium, sodium, cesium, silver, gold, phosphorous, arsenic, or bismuth. The method can include doping the metal base material with a dopant to form a doped contact layer. Doping the metal base material with a dopant can include dry-doping a molybdenum in a metallizer. Doping the metal base material with a dopant can include doping a molybdenum with about 0.1% to about 10% copper. The method can include depositing the semiconductor absorber layer adjacent to a semiconductor window layer. The semiconductor absorber layer can include a cadmium telluride layer. The semiconductor window layer can include a cadmium sulfide layer. The method can include depositing the semiconductor window layer adjacent to a transparent conductive oxide stack. The transparent conductive oxide stack can include a buffer layer adjacent to a transparent conductive oxide layer. The transparent conductive oxide layer can be positioned adjacent to one or more barrier layers. The method can include depositing the transparent conductive oxide stack adjacent to a first substrate. The first substrate can include a glass, for example, a soda-lime glass. Each of the one or more barrier layers can include a silicon nitride, aluminum-doped silicon nitride, silicon oxide, aluminum-doped silicon oxide, boron-doped silicon nitride, phosphorous-doped silicon nitride, silicon oxide-nitride, or tin oxide. The transparent conductive oxide layer can include a cadmium stannate. The buffer layer can include zinc tin oxide, tin oxide, zinc oxide, or zinc magnesium oxide. The method can include annealing the transparent conductive oxide stack. The method can include depositing a back support adjacent to the doped contact layer.

In one aspect, a photovoltaic module may include a plurality of photovoltaic cells adjacent to a substrate. The photovoltaic module may include a back cover adjacent to the plurality of photovoltaic cells. The plurality of photovoltaic cells may include a doped contact layer adjacent to a semiconductor absorber layer. The doped contact layer may include a metal base material and a dopant.

The photovoltaic module may include a first strip of tape having a length distributed along each back contact layer. The first strip of tape may include a front surface and a back surface. Each surface may contain an adhesive. The photovoltaic module may include a first lead foil distributed along the length of the first strip of tape. The photovoltaic module may include a second strip of tape, having a length shorter than that of the first strip of tape, distributed along the length and between the ends of the first strip of tape. The second strip of tape may include a front and back surface. Each surface may contain an adhesive. The photovoltaic module may include a second lead foil, having a length shorter than that of the second strip of tape, distributed along the length of the second strip of tape. The photovoltaic module may include a plurality of parallel bus bars, positioned adjacent and perpendicular to the first and second strips of tape. Each one of the plurality of parallel bus bars may contact one of the first or second lead foils. The photovoltaic module may include first and second submodules. The first submodule may include two or more cells of the plurality of photovoltaic cells connected in series. The second submodule may include another two or more cells of the plurality of photovoltaic cells connected in series. The first and second submodules may be connected in parallel through a shared cell.

In one aspect, a method for generating electricity may include illuminating a photovoltaic cell with a beam of light to generate a photocurrent. The method may include collecting the generated photocurrent. The photovoltaic cell may include a doped contact layer adjacent to a semiconductor absorber layer. The doped contact layer may include a metal base material and a dopant.

Referring to FIG. 1, a photovoltaic device 10 can include a transparent conductive oxide layer 130 adjacent to a substrate 100. Transparent conductive oxide layer 130 can be deposited adjacent to substrate 100, or the layers can be pre-fabricated. Transparent conductive oxide layer 130 can be deposited using any known deposition technique, including sputtering. Transparent conductive oxide layer 130 can include a cadmium stannate. Transparent conductive oxide layer 130 can be part of transparent conductive oxide stack 110. Transparent conductive oxide stack 110 can include a barrier layer 120 and a buffer layer 140. Transparent conductive oxide layer 130 can be deposited adjacent to barrier layer 120 to form transparent conductive oxide stack 110. Transparent conductive oxide layer 130 can be deposited using any known deposition technique, including sputtering. Barrier layer 120 can include a silicon dioxide or a silicon nitride. Buffer layer 140 can be deposited adjacent to transparent conductive oxide layer 130 to form transparent conductive oxide stack 110. Buffer layer 140 can be deposited using any known deposition technique, including sputtering. Buffer layer 140 can include a zinc stannate or a tin oxide. Transparent conductive oxide stack 110 from FIG. 1 can be annealed to form annealed transparent conductive oxide stack 200 from FIG. 2.

Transparent conductive oxide stack 200 can be manufactured using a variety of deposition techniques, including for example, low pressure chemical vapor deposition, atmospheric pressure chemical vapor deposition, plasma-enhanced chemical vapor deposition, thermal chemical vapor deposition, DC or AC sputtering, spin-on deposition, and spray-pyrolysis. Each deposition layer can be of any suitable thickness, for example in the range of about 1 to about 5000 A.

Referring to FIG. 2, a photovoltaic device 20 can include a semiconductor bi-layer 210 deposited adjacent to transparent conductive oxide layer 130. Semiconductor bi-layer 210 can be deposited using any known deposition technique, including sputtering and vapor transport deposition. Semiconductor bi-layer 210 can include a semiconductor absorber layer 230 and a semiconductor window layer 220. Semiconductor window layer 220 can be deposited adjacent to transparent conductive oxide layer 130. Semiconductor window layer 220 can be deposited using any known deposition technique, including vapor transport deposition. Semiconductor window layer 220 can include a cadmium sulfide layer. Semiconductor absorber layer 230 can be deposited adjacent to semiconductor window layer 220. Semiconductor absorber layer 230 can be deposited using any known deposition technique, including vapor transport deposition. Semiconductor absorber layer 230 can include a cadmium telluride layer.

In continuing reference to FIG. 2, doped contact layer 240 can serve as a back contact of photovoltaic device 20 and be deposited adjacent to semiconductor bi-layer 210. Doped contact layer 240 can be deposited adjacent to semiconductor absorber layer 230. Doped contact layer 240 can be deposited using any known deposition technique, including sputtering, and can include a metal base material and a dopant. For example, doped contact layer 240 can include a copper-doped molybdenum. However, doped contact layer 240 is not limited to any specific metal base material or dopant and can thus include various suitable materials. For example, the metal base material can include molybdenum, aluminium, chromium, iron, nickel, titanium, vanadium, manganese, cobalt, zinc, ruthenium, tungsten, silver, gold, or platinum. And the dopant can include copper, antimony, potassium, sodium, cesium, silver, gold, phosphorous, arsenic, or bismuth.

Doped contact layer 240 can either be pre-fabricated, or it can be formed using any suitable materials and process. Doped contact layer 240 can include any suitable amount of copper. For example, a doped molybdenum can include a copper concentration of about 0.1% to about 10% copper. The molybdenum can be doped using any suitable process, including dry-doping. For example, contact layer 240 can be formed by dry-copper-doping a molybdenum in a metallizer. Doped contact layer 240 can also be of a suitable thickness, for example greater than about 10 A, greater than about 20 A, greater than about 50 A, greater than about 100 A, greater than about 250 A, greater than about 500 A, less than about 2000 A, less than about 1500 A, less than about 1000 A, or less than about 750 A. In continuing reference to FIG. 2, a back support 250 can be deposited adjacent to doped contact layer 240. Back support 250 can include a glass, for example a soda-lime glass.

In one experiment, the performance of a photovoltaic device with a copper-doped molybdenum back contact was compared with that of a control device. Secondary ion mass spectroscopy (SIMS) indicated higher copper concentration in the copper-doped molybdenum device than in the control cell. The effectiveness of the doped back contact can be increased by augmenting the thickness of the copper-doped molybdenum. In general, devices with doped contact layers exhibited higher efficiency, open circuit voltage, and fill factor than the control cells. In another experiment, the light-soaking stability of copper-doped molybdenum devices was analyzed. Results indicated higher efficiency and open circuit voltage for devices with copper-doped molybdenum contact layers.

Photovoltaic devices can be formed on optically transparent substrates, such as glass. Because glass is not conductive, a transparent conductive oxide (TCO) layer is typically deposited between the substrate and the semiconductor bi-layer to serve as a front contact. A metal layer can be deposited onto the p-type absorber layer to serve as a back contact. The front and back contacts can serve as electrodes for the photovoltaic device. A variety of materials are available for the metal layer, including, but not limited to molybdenum, aluminum, chromium, iron, nickel, titanium, vanadium, manganese, cobalt, zinc, ruthenium, tungsten, silver, gold, and platinum. Molybdenum functions particularly well as a back contact metal due to its relative stability at processing temperatures and low contact resistance. Copper has also proven effective for preserving fill factor. The inventions disclosed herein relate to the composition and deposition of back contacts for photovoltaic devices.

Photovoltaic devices/cells fabricated using the methods discussed herein may be incorporated into one or more photovoltaic modules, each of which may include one or more submodules. Such modules may by incorporated into various systems for generating electricity. For example, a photovoltaic module may include one or more submodules consisting of multiple photovoltaic cells connected in series. One or more submodules may be connected in parallel via a shared cell to form a photovoltaic module.

A bus bar assembly may be attached to a contact surface of a photovoltaic module to enable connection to additional electrical components (e.g., one or more additional modules). For example, a first strip of double-sided tape may be distributed along a length of the module, and a first lead foil may be applied adjacent thereto. A second strip of double-sided tape (smaller than the first strip) may be applied adjacent to the first lead foil. A second lead foil may be applied adjacent to the second strip of double-sided tape. The tape and lead foils may be positioned such that at least one portion of the first lead foil is exposed, and at least one portion of the second lead foil is exposed. Following application of the tape and lead foils, a plurality of bus bars may be positioned along the contact region of the module. The bus bars may be positioned parallel from one another, at any suitable distance apart. For example, the plurality of bus bars may include at least one bus bar positioned on a portion of the first lead foil, and at least one bus bar positioned on a portion of the second lead foil. The bus bar, along with the portion of lead foil on which it has been applied, may define a positive or negative region. A roller may be used to create a loop in a section of the first or second lead foil. The loop may be threaded through the hole of a subsequently deposited back glass. The photovoltaic module may be connected to other electronic components, including, for example, one or more additional photovoltaic modules. For example, the photovoltaic module may be electrically connected to one or more additional photovoltaic modules to form a photovoltaic array.

The photovoltaic cells/modules/arrays may be included in a system for generating electricity. For example, a photovoltaic cell may be illuminated with a beam of light to generate a photocurrent. The photocurrent may be collected and converted from direct current (DC) to alternating current (AC) and distributed to a power grid. Light of any suitable wavelength may be directed at the cell to produce the photocurrent, including, for example, more than 400 nm, or less than 700 nm (e.g., ultraviolet light). Photocurrent generated from one photovoltaic cell may be combined with photocurrent generated from other photovoltaic cells. For example, the photovoltaic cells may be part of one or more photovoltaic modules in a photovoltaic array, from which the aggregate current may be harnessed and distributed.

The embodiments described above are offered by way of illustration and example. It should be understood that the examples provided above may be altered in certain respects and still remain within the scope of the claims. It should be appreciated that, while the invention has been described with reference to the above preferred embodiments, other embodiments are within the scope of the claims.

What is claimed is:

1. A photovoltaic device, comprising:
   a copper-doped molybdenum contact layer in direct contact with a semiconductor absorber layer, wherein the doped contact layer comprises a copper concentration of about 0.1% to about 10%, wherein the semiconductor absorber layer comprises a cadmium telluride layer.

2. The photovoltaic device of claim 1, further comprising a semiconductor window layer, wherein the semiconductor absorber layer is positioned adjacent to the semiconductor window layer, and wherein the semiconductor window layer and the semiconductor absorber layer are at least a part of a semiconductor bi-layer.

3. A photovoltaic module comprising:
   a plurality of photovoltaic cells adjacent to a substrate; and
   a back cover adjacent to the plurality of photovoltaic cells, the plurality of photovoltaic cells comprising:
   a copper-doped molybdenum contact layer in direct contact with a semiconductor absorber layer, wherein the doped contact layer comprises a copper concentration of about 0.1% to about 10%, wherein the semiconductor absorber layer comprises a cadmium telluride layer.

4. The photovoltaic module of claim 3, further comprising:
   a first strip of tape having a length distributed along each doped contact layer, the first strip of tape comprising a front surface and a back surface, each surface containing an adhesive; a first lead foil distributed along the length of the first strip of tape;
   a second strip of tape, having a length shorter than that of the first strip of tape, distributed along the length and between the ends of the first strip of tape, wherein the second strip of tape comprises a front and back surface, each containing an adhesive;
   a second lead foil, having a length shorter than that of the second strip of tape, distributed along the length of the second strip of tape; and
   a plurality of parallel bus bars, positioned adjacent and perpendicular to the first and second strips of tape, wherein each one of the plurality of parallel bus bars contacts one of the first or second lead foils.

5. The photovoltaic module of claim 4, further comprising first and second submodules, wherein the first submodule comprises two or more cells of the plurality of photovoltaic cells connected in series, and the second submodule comprises another two or more cells of the plurality of photovoltaic cells connected in series, wherein the first and second submodules are connected in parallel through a shared cell.

\* \* \* \* \*